(12) United States Patent
Sakurai et al.

(10) Patent No.: US 11,538,710 B2
(45) Date of Patent: Dec. 27, 2022

(54) CARRIER PLATE REMOVING METHOD

(71) Applicant: DISCO CORPORATION, Tokyo (JP)

(72) Inventors: Takatoshi Sakurai, Tokyo (JP);
Yoshihiro Omuro, Tokyo (JP);
Katsuhiko Suzuki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/371,749

(22) Filed: Jul. 9, 2021

(65) Prior Publication Data

US 2022/0028723 A1      Jan. 27, 2022

(30) Foreign Application Priority Data

Jul. 21, 2020   (JP) ............................. JP2020-124250

(51) Int. Cl.
*B32B 43/00*      (2006.01)
*H01L 21/683*      (2006.01)

(52) U.S. Cl.
CPC ........ *H01L 21/6835* (2013.01); *B32B 43/006* (2013.01); *B32B 2310/028* (2013.01); *B32B 2457/00* (2013.01); *H01L 2221/68386* (2013.01); *Y10T 156/1111* (2015.01); *Y10T 156/1121* (2015.01); *Y10T 156/1126* (2015.01); *Y10T 156/1168* (2015.01); *Y10T 156/1184* (2015.01); *Y10T 156/1922* (2015.01); *Y10T 156/1928* (2015.01); *Y10T 156/1933* (2015.01)

(58) Field of Classification Search
CPC .. B32B 38/10; B32B 43/006; Y10T 156/1111; Y10T 156/1121; Y10T 156/1126; Y10T 156/1168; Y10T 156/1184; Y10T 156/1922; Y10T 156/1928; Y10T 156/1933
See application file for complete search history.

(56) References Cited

U.S. PATENT DOCUMENTS 5,447,596 A  *  9/1995  Hayase ............... H01L 21/6835
                                                 156/701
8,701,734 B2 *  4/2014  Nakamura ........ H01L 21/67092
                                                 156/758
(Continued)

FOREIGN PATENT DOCUMENTS

JP      2016201519 A      12/2016
JP      2020119952 A  *   8/2020  ......... H01L 21/6835

*Primary Examiner* — Philip C Tucker
*Assistant Examiner* — Nickolas R Harm
(74) *Attorney, Agent, or Firm* — Greer Burns & Crain Ltd.

(57) ABSTRACT

There is provided a carrier plate removing method for removing a carrier plate from a workpiece disposed on a top surface of a carrier plate via a provisional bonding layer. The carrier plate removing method includes a stepped portion forming step of forming a stepped portion in which the workpiece projects sideward as compared with the carrier plate by processing the carrier plate so as to remove a peripheral portion of the carrier plate along a peripheral edge of the carrier plate from an undersurface side opposite from the top surface of the carrier plate, a carrier plate holding step of holding the carrier plate by a carrier plate holding unit, and a removing step of removing the carrier plate from the workpiece by applying a force from the carrier plate side to the stepped portion, and moving the workpiece in a direction of separating from the carrier plate.

12 Claims, 7 Drawing Sheets

(56) References Cited

U.S. PATENT DOCUMENTS

| | | | |
|---|---|---|---|
| 2011/0048611 A1* | 3/2011 | Carre | H01L 21/6836 156/73.1 |
| 2011/0308739 A1* | 12/2011 | McCutcheon | H01L 21/67092 156/766 |
| 2012/0000613 A1* | 1/2012 | Thallner | B32B 43/006 156/703 |
| 2013/0025796 A1* | 1/2013 | Burggraf | B32B 37/025 156/703 |
| 2019/0275782 A1* | 9/2019 | Bennett | B32B 38/1858 |
| 2020/0051847 A1* | 2/2020 | Kiuchi | H01L 21/68785 |
| 2020/0230936 A1* | 7/2020 | Suzuki | B32B 43/006 |

* cited by examiner

CARRIER PLATE REMOVING METHOD

BACKGROUND OF THE INVENTION

Field of the Invention

The present invention relates to a carrier plate removing method for removing a carrier plate from a workpiece provided to a top surface of the carrier plate via a provisional bonding layer.

Description of the Related Art

In an electronic apparatus typified by a mobile phone or a personal computer, a device chip including a device such as an electronic circuit has become an essential constituent element. The device chip is obtained by, for example, demarcating the top surface of a wafer formed of a semiconductor material such as silicon into a plurality of regions by planned dividing lines (streets), forming a device in each of the regions, and thereafter dividing the wafer along the planned dividing lines.

The device chip obtained by a method as described above is, for example, fixed to a mother substrate for a chip size package (CSP), electrically connected to terminals of the mother substrate or the like by a method such as wire bonding, and thereafter sealed by a molded resin. When a packaged device is formed by thus sealing the device chip with the molded resin, the device chip can be protected from external factors such as impact, light, heat, and water.

In recent years, a packaging technology referred to as a fan-out wafer level package (FOWLP) has started to be adopted, in which technology package terminals are formed outside the region of the device chip by using a wafer level rewiring technology (see Japanese Patent Laid-Open No. 2016-201519, for example). In addition, a packaging technology referred to as a fan-out panel level package (FOPLP) has also been proposed, in which technology packaged devices are manufactured en bloc on a level of a panel having a larger size than a wafer (typically, a glass substrate used for manufacturing a liquid crystal panel).

In FOPLP, for example, a wiring layer (redistribution layer (RDL)) is formed on the top surface of a carrier plate serving as a provisional substrate via a provisional bonding layer, and device chips are bonded to the wiring layer. Next, a packaged panel is obtained by sealing the device chips with a molded resin. Thereafter, the packaged panel is thinned by a method such as grinding, and then the packaged panel is divided. Packaged devices are thereby completed.

SUMMARY OF THE INVENTION

In the above-described FOPLP, for example, the carrier plate is removed from the packaged devices after the packaged panel is divided into the packaged devices. Specifically, each packaged device is picked up from the carrier plate. However, when the packaged devices have a small size, it is difficult to pick up the packaged devices from the carrier plate.

On the other hand, it is conceivable that the carrier plate is peeled off and removed from the packaged panel before the packaged panel is divided into the packaged devices. However, because the adhesive strength of the provisional bonding layer is strong to a certain degree, it is difficult to peel the carrier plate off from the packaged panel without damaging the packaged panel and the carrier plate.

It is accordingly an object of the present invention to provide a carrier plate removing method that makes it possible to easily remove a carrier plate from a workpiece such as a packaged panel.

In accordance with an aspect of the present invention, there is provided a carrier plate removing method for removing a carrier plate from a workpiece disposed on a top surface of a carrier plate via a provisional bonding layer. The carrier plate removing method includes a stepped portion forming step of forming a stepped portion in which the workpiece projects sideward as compared with the carrier plate by processing the carrier plate so as to remove a peripheral portion of the carrier plate along a peripheral edge of the carrier plate from an undersurface side opposite from the top surface of the carrier plate, a carrier plate holding step of holding the carrier plate by a carrier plate holding unit after performing the stepped portion forming step, and a removing step of removing the carrier plate from the workpiece by applying a force from the carrier plate side to the stepped portion, and moving the workpiece in a direction of separating from the carrier plate after performing the stepped portion forming step.

In the removing step, the workpiece may be moved in the direction of separating from the carrier plate by the force applied to the stepped portion. The carrier plate removing method may further include a workpiece holding step of holding the workpiece by a workpiece holding unit before performing the removing step. In addition, preferably, in the removing step, the carrier plate is removed from the workpiece by applying the force to the stepped portion by moving the carrier plate holding unit relative to the workpiece holding unit and an external force applying member in a state in which the external force applying member is held in contact with the stepped portion from the carrier plate side. In addition, preferably, in the removing step, a starting point region serving as a starting point at a time of removing the carrier plate from the workpiece is formed in the provisional bonding layer by curving the peripheral portion of the carrier plate in a direction of separating from the workpiece before the carrier plate holding unit is moved relative to the workpiece holding unit and the external force applying member.

In addition, in the removing step, the workpiece may be moved in a direction of separating from the carrier plate after a starting point region serving as a starting point at a time of removing the carrier plate from the workpiece is formed in the provisional bonding layer by curving a peripheral portion of the workpiece in a direction of separating from the carrier plate by the force applied to the stepped portion. The carrier plate removing method may further include a workpiece holding step of holding the workpiece by a workpiece holding unit before performing the removing step.

In addition, preferably, in the removing step, the carrier plate is removed from the workpiece by applying the force to the stepped portion after spraying a fluid between the workpiece and the carrier plate or while spraying the fluid between the workpiece and the carrier plate.

In addition, preferably, in the removing step, the carrier plate is removed from the workpiece by applying the force to the stepped portion in a state in which the workpiece and the carrier plate are immersed in a liquid. In the removing step, preferably, the carrier plate is removed from the workpiece by applying the force to the stepped portion by pressing an external force applying member to which vibration is imparted against the stepped portion in a state in which the workpiece and the carrier plate are immersed in the liquid. Alternatively, preferably, in the removing step, the carrier plate is removed from the workpiece by applying the force to the stepped portion while imparting vibration to the liquid in a state in which the workpiece and the carrier plate are immersed in the liquid. The liquid may include a surfactant.

In the carrier plate removing method according to one aspect of the present invention, the stepped portion in which the workpiece projects sideward as compared with the carrier plate is formed by processing the carrier plate so as to remove the peripheral portion of the carrier plate along the peripheral edge of the carrier plate from the undersurface side of the carrier plate. Thus, the carrier plate can be removed from the workpiece easily by applying the force to the stepped portion from the carrier plate side.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment according to one aspect of the present invention will hereinafter be described with reference to the accompanying drawings. A carrier plate removing method according to the present embodiment is used to remove a carrier plate from a workpiece provided to the top surface of the carrier plate via a provisional bonding layer. The carrier plate removing method according to the present embodiment includes a stepped portion forming step (see FIG. 1B, FIG. 2A, and FIG. 2B), a carrier plate holding step (see FIG. 3A), and a removing step (see FIG. 3B and FIG. 3C).

The stepped portion forming step forms a stepped portion of the workpiece and the carrier plate by making a cutting blade cut into a peripheral portion of the carrier plate along a peripheral edge of the carrier plate from an undersurface side opposite from the top surface of the carrier plate provided with the workpiece, and thereby removing the peripheral portion of the carrier plate. The carrier plate holding step holds the carrier plate from above in a state in which the carrier plate is located above the workpiece.

The removing step removes the carrier plate from the workpiece by applying a downward force to the workpiece side of the stepped portion by an external force applying member (push member), and moving the workpiece in a direction of separating from the carrier plate. In the following, the carrier plate removing method according to the present embodiment will be described in detail.

Figure 1A:
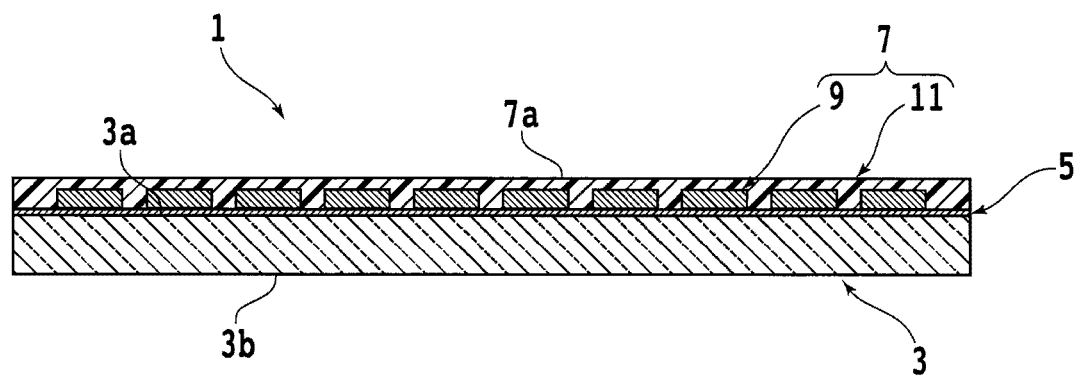
FIG. 1A is a sectional view depicting an example of a configuration of a composite substrate including a carrier plate and a workpiece.

FIG. 1A is a sectional view depicting an example of a configuration of a composite substrate 1 used in the carrier plate removing method according to the present embodiment. The composite substrate 1, for example, includes a carrier plate 3 formed by an insulator material such as soda glass, borosilicate glass, or quartz glass. The carrier plate 3, for example, has a substantially flat first surface (top surface) 3a and a second surface (undersurface) 3b on an opposite side from the first surface 3a. The carrier plate 3 is formed in a rectangular shape as viewed in plan from the first surface 3a side or the second surface 3b side. The thickness of the carrier plate 3 is, for example, 2 mm or less, or is typically 1.1 mm.

It is to be noted that while the present embodiment uses the carrier plate 3 formed by an insulator material such as soda glass, borosilicate glass, or quartz glass, the material, shape, structure, size, and the like of the carrier plate 3 are not particularly limited. For example, a plate or the like formed by a material such as a semiconductor, a ceramic, a resin, or a metal can also be used as the carrier plate 3. A disk-shaped semiconductor wafer or the like may also be used as the carrier plate 3.

A workpiece 7 is provided to the first surface 3a side of the carrier plate 3 via a provisional bonding layer 5. The provisional bonding layer 5 is, for example, formed on substantially the whole of the first surface 3a by superposing a metallic film, an insulator film, or the like. The provisional bonding layer 5 has a function of bonding the carrier plate 3 and the workpiece 7 to each other. In addition, the provisional bonding layer 5 may be formed by a resin film or the like that functions as an adhesive.

The thickness of the provisional bonding layer 5 is, for example, 20 μm or less, or is typically approximately 0.6 μm. When the carrier plate 3 is peeled off and removed from the workpiece 7 in the removing step to be described later, the provisional bonding layer 5 is separated into a first part 5a (see FIG. 3C) closely adhering to the carrier plate 3 side and a second part 5b (see FIG. 3C) closely adhering to the workpiece 7 side.

The workpiece 7 is referred to also as a packaged panel, a packaged wafer, or the like, for example. The workpiece 7 includes a wiring layer (RDL) (not depicted) in contact with the provisional bonding layer 5, a plurality of device chips 9 bonded to the wiring layer, and a molded resin layer 11 sealing each device chip 9. The workpiece 7 is, for example, formed in substantially a same size and a same shape as the carrier plate 3 as viewed in plan. In addition, the thickness of the workpiece 7 is, for example, 1.5 mm or less, or is typically 0.6 mm.

Incidentally, the first surface (top surface) 7a side of the workpiece 7 may be processed by a method such as grinding. In addition, planned dividing lines (planned cutting lines) are set in regions between device chips 9 adjacent to each other within the workpiece 7. The workpiece 7 is divided into a plurality of workpiece pieces each including one or a plurality of device chips 9 by cutting the workpiece 7 along optional planned dividing lines.

When the workpiece 7 (or the workpiece pieces) is cut along all of the planned dividing lines, a plurality of packaged devices corresponding to the respective device chips 9 are obtained. However, the material, shape, structure, size, and the like of the workpiece 7 are not particularly limited. For example, the workpiece 7 may be formed mainly by the wiring layer, and may not include the device chips 9 nor the molded resin layer 11 or the like.

Figure 1B:
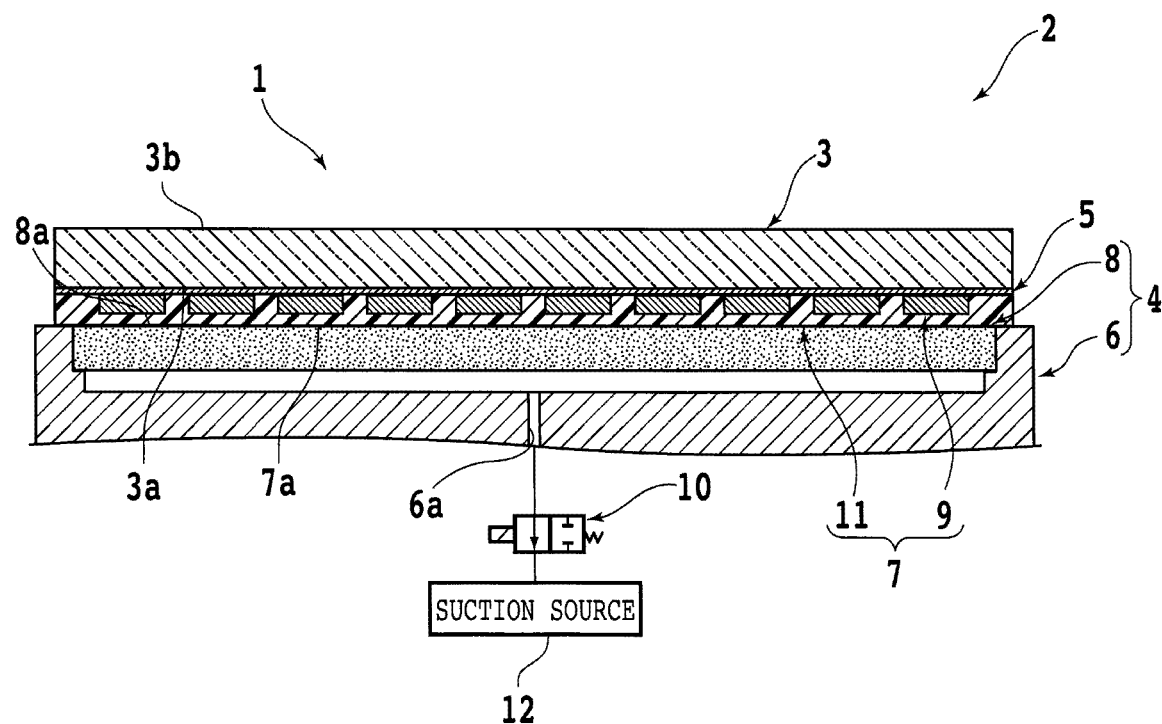
FIG. 1B is a sectional view depicting a state in which the workpiece side of the composite substrate is held in a stepped portion forming step.

The carrier plate removing method according to the present embodiment first performs the stepped portion forming step of forming a stepped portion in a peripheral portion of the composite substrate 1 described above. Specifically, first, the workpiece 7 side of the composite substrate 1 is held, and the carrier plate 3 side is exposed upward. FIG. 1B is a sectional view depicting a state in which the workpiece 7 side of the composite substrate 1 is held in the stepped portion forming step. Incidentally, in FIG. 1B, a part of constituent elements are represented by a functional block.

This stepped portion forming step is performed by using a cutting apparatus 2 depicted in FIG. 1B and the like. The cutting apparatus 2 includes a chuck table 4 for holding the composite substrate 1. The chuck table 4, for example, includes a cylindrical frame body 6 formed of a metallic material typified by stainless steel and a holding plate 8 formed of a porous material and disposed in an upper portion of the frame body 6.

The upper surface of the holding plate 8 is a holding surface 8a for sucking and holding the workpiece 7 side of the composite substrate 1. The lower surface side of the holding plate 8 is connected to a suction source 12 via a flow passage 6a provided within the frame body 6, a valve 10, and the like. Therefore, when the valve 10 is opened, a negative pressure of the suction source 12 can be made to act on the holding surface 8a.

The chuck table 4 (frame body 6) is coupled to a rotational driving source (not depicted) such as a motor, and is rotated about a rotational axis substantially perpendicular to the holding surface 8a described above by a force generated by the rotational driving source. In addition, the chuck table 4 (frame body 6) is supported by a processing feed mechanism (not depicted) and is thereby moved in a processing feed direction substantially parallel with the holding surface 8a described above.

When the workpiece 7 side of the composite substrate 1 is held and the carrier plate 3 side is exposed upward, as depicted in FIG. 1B, for example, the first surface 7a of the workpiece 7 is brought into contact with the holding surface 8a of the chuck table 4. Then, the valve 10 is opened to make a negative pressure of the suction source 12 act on the holding surface 8a. Consequently, the workpiece 7 side of the composite substrate 1 is held by the chuck table 4, and the carrier plate 3 side is exposed upward.

Figure 2A:
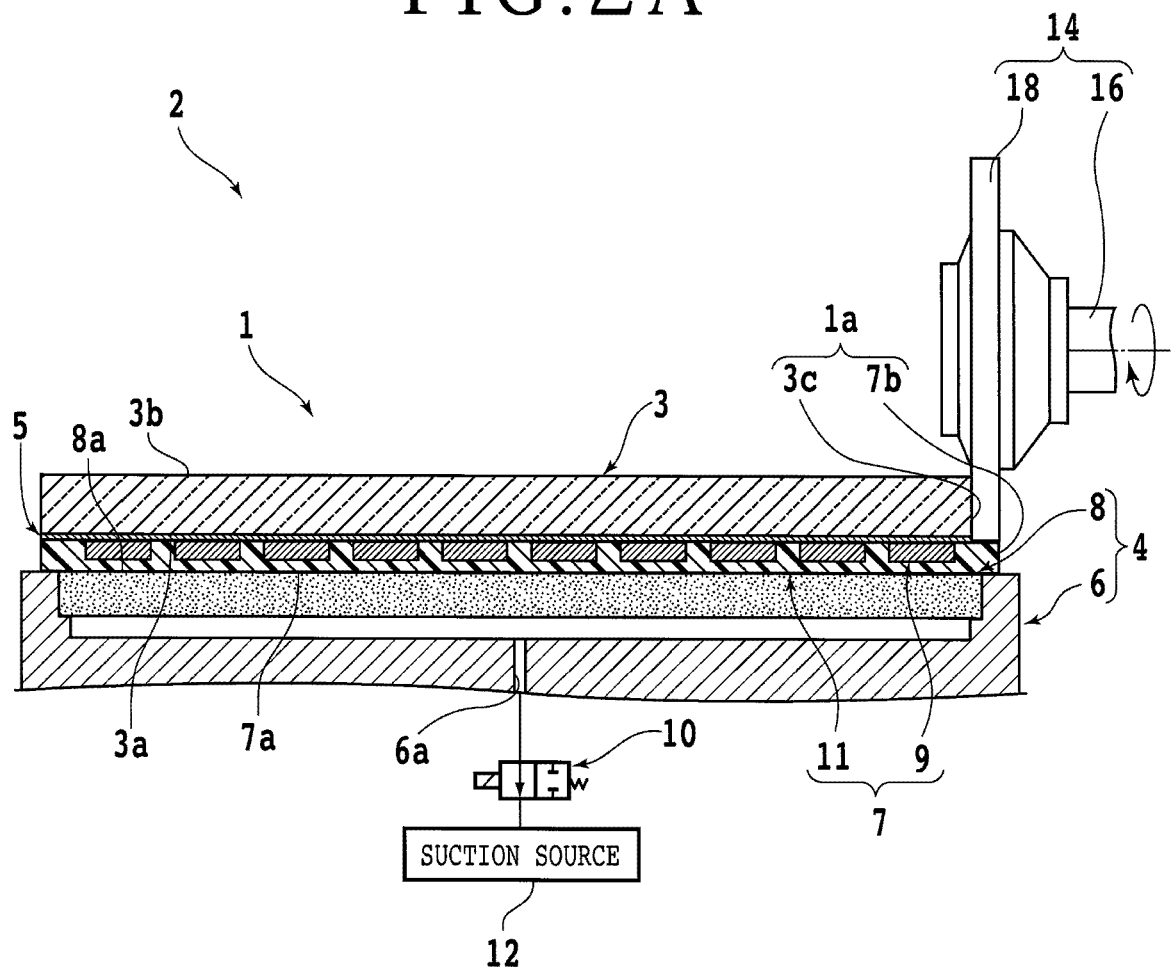
FIG. 2A is a sectional view depicting a state in which a stepped portion is formed on the composite substrate in the stepped portion forming step.

After the workpiece 7 side of the composite substrate 1 is held and the carrier plate 3 side is exposed upward, a stepped portion is formed on the composite substrate 1 by processing the carrier plate 3 along a peripheral edge of the carrier plate 3. FIG. 2A is a sectional view depicting a state in which a stepped portion 1a is formed on the composite substrate 1 in the stepped portion forming step. Incidentally, in FIG. 2A, a part of constituent elements are represented by a functional block.

As depicted in FIG. 2A, a cutting unit 14 is disposed above the chuck table 4. The cutting unit 14 includes a spindle 16 having a rotational axis substantially parallel with the holding surface 8a. An annular cutting blade 18 formed by distributing abrasive grains in a binding material is fitted to one end side of the spindle 16.

A rotational driving source (not depicted) such as a motor is coupled to another end side of the spindle 16. The cutting blade 18 fitted to the one end side of the spindle 16 is rotated by a force generated by the rotational driving source. The cutting unit 14 is, for example, supported by a raising and lowering mechanism (not depicted) and an indexing feed mechanism (not depicted), and is thereby moved in a vertical direction substantially perpendicular to the holding surface 8a and an indexing feed direction substantially perpendicular to the vertical direction and the processing feed direction.

When the stepped portion 1a is to be formed on the composite substrate 1, first, a part of the peripheral edges of the carrier plate 3 (part corresponding to one side of a rectangle as viewed in plan) which part is to be processed (removed) is set substantially parallel with the processing feed direction by rotating the chuck table 4 holding the composite substrate 1. Next, the cutting blade 18 is positioned above an extension of the part of the peripheral edges described above by moving the chuck table 4 and the cutting unit 14 relative to each other.

In addition, a lower end of the cutting blade 18 is positioned at a position lower than the first surface 3a of the carrier plate 3 and slightly higher than an interface between the provisional bonding layer 5 and the workpiece 7. Thereafter, the chuck table 4 is moved in the processing feed direction while the cutting blade 18 is rotated. As depicted in FIG. 2A, it is thereby possible to make the cutting blade 18 cut in along a part of the peripheral edges of the carrier plate 3 from the second surface 3b side, and consequently remove a part of a peripheral portion of the carrier plate 3 including the part of the peripheral edges.

In the present embodiment, as described above, the cutting blade 18 is made to cut in to a depth reaching the first surface 3a of the carrier plate 3. Therefore, the stepped portion 1a in a stepped shape such that a peripheral portion 7b of the workpiece projects sideward (outward in a direction parallel with the first surface 3a or the second surface 3b) as compared with the peripheral portion 3c of the carrier plate 3 after being processed is formed on a part of the peripheral portion of the composite substrate 1.

An overlapping width of the carrier plate 3 (peripheral portion) and the cutting blade 18 (that is, the width of the removed peripheral portion in the carrier plate 3 or an amount of projection of the peripheral portion 7b of the workpiece 7) is set in a range where the stepped portion 1a having a size suitable for application of a force is obtained. In consideration of an actual width of the cutting blade 18 and the like, the overlapping width is preferably set at, for example, 0.2 mm to 5 mm.

Figure 2B:
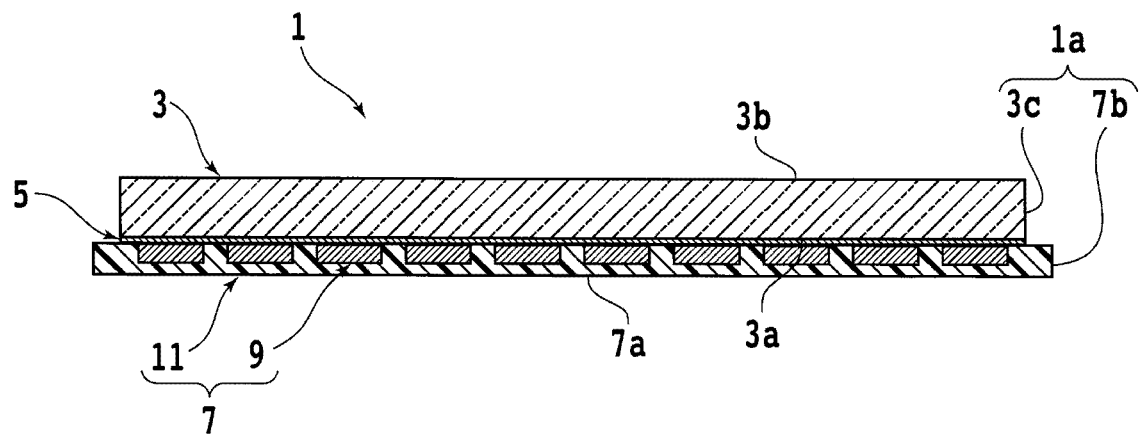
FIG. 2B is a sectional view depicting a state in which the stepped portion is formed on the whole of a peripheral portion of the composite substrate.

After the stepped portion 1a is formed on a part of the peripheral portion of the composite substrate 1 by removing a part of the peripheral portion of the carrier plate 3 by the procedure as described above, the stepped portion 1a is formed also on another part of the peripheral portion of the composite substrate 1 by removing another part of the peripheral portion of the carrier plate 3 by a similar procedure. The stepped portion forming step is ended when the whole of the peripheral portion of the carrier plate 3 is removed, and the stepped portion 1a is formed on the whole of the peripheral portion of the composite substrate 1. FIG. 2B is a sectional view depicting a state in which the stepped portion 1a is formed on the whole of the peripheral portion of the composite substrate 1.

It is to be noted that while the stepped portion 1a is formed on the whole of the peripheral portion of the composite substrate 1 in the present embodiment as depicted in FIG. 2B, it suffices to form the stepped portion 1a on at least an optional part of the peripheral portion of the composite substrate 1. In this case, the shape of the stepped portion 1a (shape as viewed from the carrier plate 3 side) or the like can also be set optionally. In addition, in a case where the carrier plate and the workpiece constituting the composite substrate is in a circular shape as viewed in plan (that is, in a disk shape), the stepped portion can be formed on the composite substrate by rotating the chuck table 4 while making the cutting blade 18 cut into the peripheral portion of the carrier plate, for example. Of course, also in this case, the stepped portion may be formed such that only an optional part of the peripheral portion of the carrier plate is cut away.

Figure 3A:
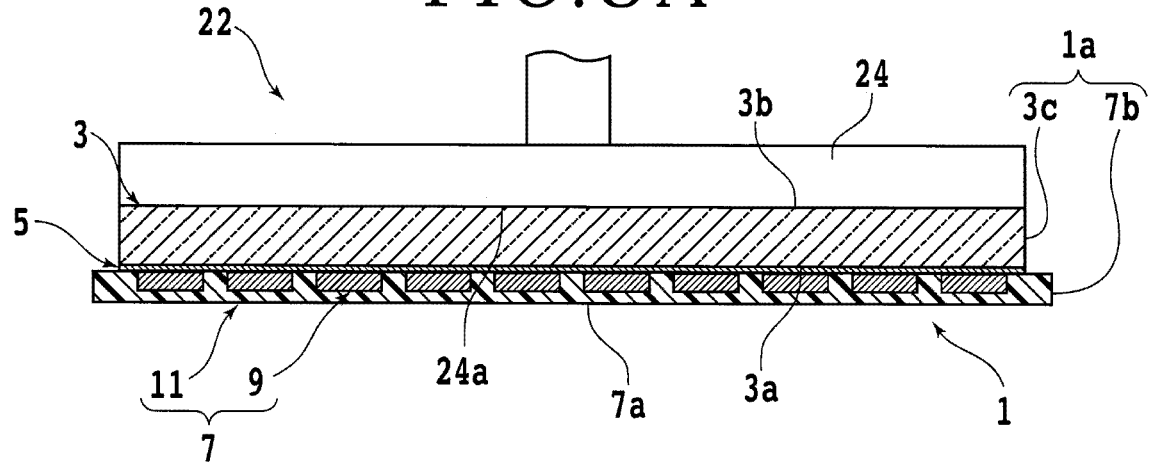
FIG. 3A is a sectional view depicting a carrier plate holding step.

After the stepped portion forming step, the carrier plate holding step is performed which holds the carrier plate 3 side of the composite substrate 1. FIG. 3A is a sectional view depicting the carrier plate holding step. The carrier plate holding step is performed by using a peeling apparatus 22 depicted in FIG. 3A and the like. The peeling apparatus 22 includes a carrier plate holding unit 24 for holding the carrier plate 3 side of the composite substrate 1 from above.

A holding surface 24a having a similar size to the second surface 3b of the carrier plate 3 is formed on a lower portion of the carrier plate holding unit 24. A suction source (not depicted) is connected to the holding surface 24a via a flow passage (not depicted), a valve (not depicted), and the like. Therefore, when the valve is opened, a negative pressure of the suction source can be made to act on the holding surface 24a. In addition, the carrier plate holding unit 24 is supported by a raising and lowering mechanism (not depicted) and is thus moved in the vertical direction.

In the carrier plate holding step, as depicted in FIG. 3A, for example, the holding surface 24a of the carrier plate holding unit 24 is brought into contact with the second surface 3b of the carrier plate 3 in a state in which the carrier plate 3 is located above the workpiece 7. Then, the valve is opened to make a negative pressure of the suction source act on the holding surface 24a. The carrier plate 3 side of the composite substrate 1 is thereby held by the carrier plate holding unit 24 from above.

Figure 3B:
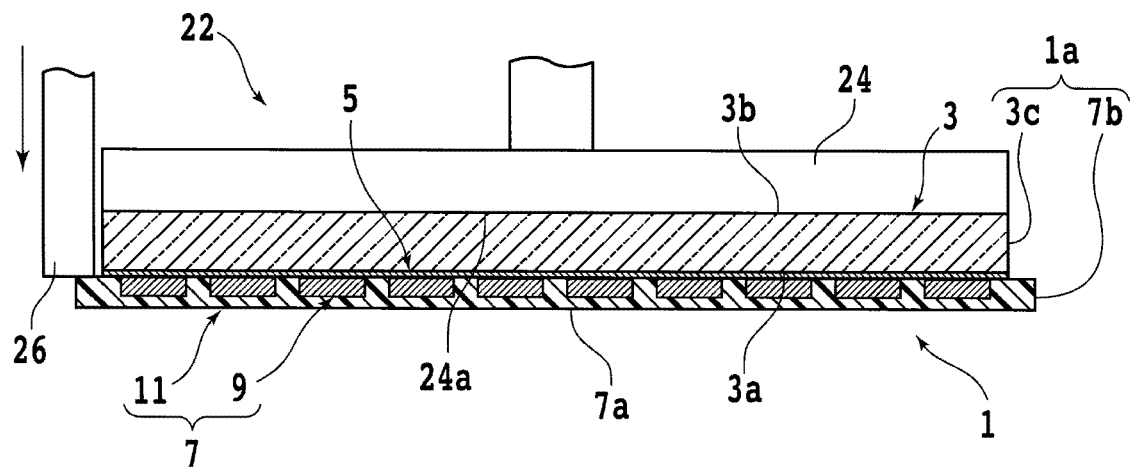
FIG. 3B is a sectional view depicting a removing step.
Figure 3C:
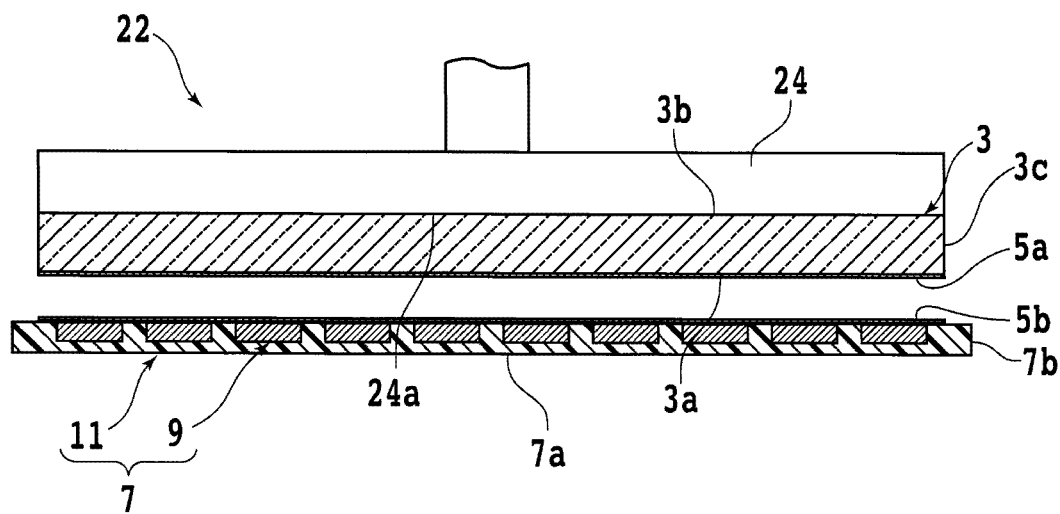
FIG. 3C is a sectional view depicting a state in which the carrier plate is removed from the workpiece.

After the carrier plate holding step, the removing step is performed which removes the carrier plate 3 from the workpiece 7. FIG. 3B is a sectional view depicting the removing step. FIG. 3C is a sectional view depicting a state in which the carrier plate 3 is removed from the workpiece 7. The removing step is performed by continuing using the peeling apparatus 22.

As depicted in FIG. 3B, on a side of the carrier plate holding unit 24, a rod-shaped external force applying member (push member) 26 having a distal end oriented downward is disposed at a position corresponding to the stepped portion 1a of the composite substrate 1 held by the carrier plate holding unit 24. The external force applying member 26 is, for example, supported by a raising and lowering mechanism (not depicted) different from the raising and lowering mechanism that moves the carrier plate holding unit 24. The external force applying member 26 is thus moved in the vertical direction independently of the carrier plate holding unit 24.

In the removing step, first, the composite substrate 1 held by the carrier plate holding unit 24 is raised by moving both of the carrier plate holding unit 24 and the external force applying member 26 upward. That is, the first surface 7a side of the workpiece 7 is exposed downward. Next, the external force applying member 26 is moved downward while the position of the carrier plate holding unit 24 is maintained, and the distal end (lower end) of the external force applying member 26 is brought into contact with a part of the stepped portion 1a which part is on the workpiece 7 side (the peripheral portion 7b of the workpiece 7) from above. A downward force is thereby applied from the external force applying member 26 to the stepped portion 1a of the composite substrate 1.

As described above, the carrier plate 3 side of the composite substrate 1 is held by the carrier plate holding unit 24 from above. Therefore, when the downward force is applied from the external force applying member 26 to the part of the stepped portion 1a which part is on the workpiece 7 side, the workpiece 7 is peeled off from the carrier plate 3 with the provisional bonding layer 5 as a boundary, and falls. That is, the workpiece 7 moves in a direction of separating from the carrier plate 3. The removing step is ended when the whole of the workpiece 7 is separated from the carrier plate 3, and the carrier plate 3 is removed from the workpiece 7.

As described above, in the carrier plate removing method according to the present embodiment, the stepped portion 1a in which the workpiece 7 projects sideward as compared with the carrier plate 3 is formed by processing the carrier plate 3 such that the peripheral portion of the carrier plate 3 is removed along the peripheral edge of the carrier plate 3 from the second surface (undersurface) 3b side of the carrier plate 3. Thus, the carrier plate 3 can be removed from the workpiece 7 easily by applying a downward force to the stepped portion 1a in a state in which the carrier plate 3 is held by the carrier plate holding unit 24 from above.

In addition, with the carrier plate removing method according to the present embodiment, it suffices to process only the carrier plate 3 side, and therefore the carrier plate 3 can be removed from the workpiece 7 without the workpiece 7 side being processed.

It is to be noted that the present invention is not limited to the description of the foregoing embodiment but can be modified and carried out in various manners. For example, while the external force applying member 26 in the foregoing embodiment is configured to be able to be moved in the vertical direction independently of the carrier plate holding unit 24, it suffices for the external force applying member 26 to be able to be moved at least relative to the carrier plate holding unit 24.

For example, the external force applying member 26 may be moved relative to the carrier plate holding unit 24 by fixing the external force applying member 26 to a casing (not depicted) of the peeling apparatus 22 or the like, and moving only the carrier plate holding unit 24. In addition, while one external force applying member 26 is used in the foregoing embodiment, a plurality of external force applying members 26 can also be used.

In addition, in the foregoing embodiment, the stepped portion 1a is formed on the composite substrate 1 by making the cutting blade 18 cut into the carrier plate 3 along the peripheral edge of the carrier plate 3 from the second surface (undersurface) 3b side of the carrier plate 3, and thereby removing the peripheral portion of the carrier plate 3. However, for example, the stepped portion 1a may be formed on the composite substrate 1 by irradiating the carrier plate 3 with a laser beam along the peripheral edge of the carrier plate 3 from the second surface 3b side of the carrier plate 3, and thereby removing the peripheral portion of the carrier plate 3.

In this case, it is preferable to subject the carrier plate 3 to ablation processing with a laser beam by using a laser processing apparatus (laser processing unit) that can apply a laser beam having a wavelength absorbed by the carrier plate 3, for example, in place of the cutting apparatus 2 (cutting unit 14). In addition, the carrier plate 3 may be modified by the laser beam by using a laser processing apparatus (laser processing unit) that can apply a laser beam having a wavelength passing through the carrier plate 3, for example. After the carrier plate 3 is modified by the laser beam, the stepped portion can be formed by applying a force to a modified region, and removing this region.

In addition, while the stepped portion 1a is formed on the composite substrate 1 without removing the peripheral portion 7b of the workpiece 7 in the foregoing embodiment, the peripheral portion 7b of the workpiece 7 may be removed depending on accuracy of the processing when the peripheral portion of the carrier plate 3 is removed. Therefore, when there seems to be no problem in the quality of the workpiece 7, the peripheral portion 7b of the workpiece 7 may be removed in a range in which the stepped portion 1a is obtained.

Figure 4A:
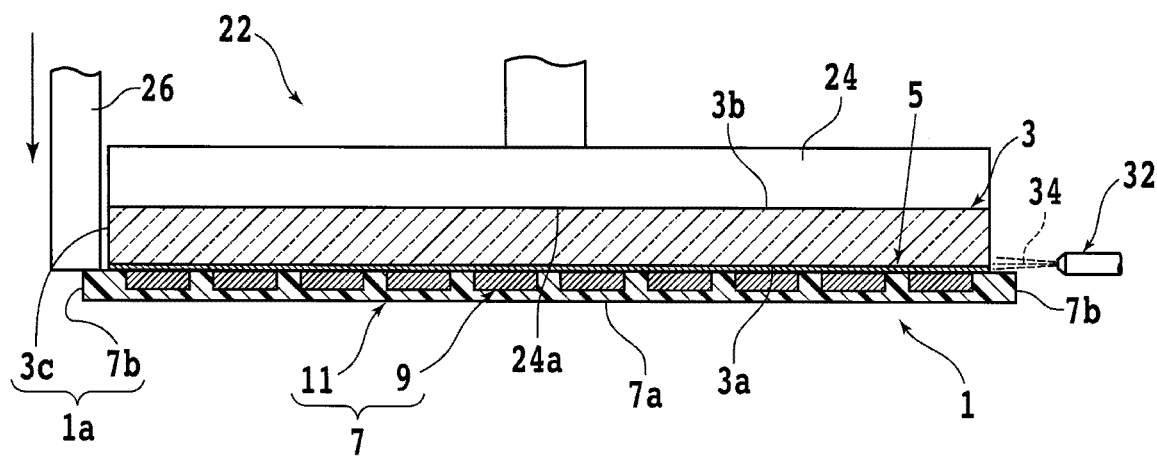
FIG. 4A is a sectional view depicting a removing step in a first modification.

In addition, when the carrier plate 3 is removed in the removing step, a fluid can be sprayed between the carrier plate 3 and the workpiece 7 (region corresponding to the provisional bonding layer 5). FIG. 4A is a sectional view depicting a removing step according to a first modification. As depicted in FIG. 4A, a nozzle 32 is disposed on a side of the carrier plate holding unit 24 of the peeling apparatus 22 used in the first modification. A supply source (not depicted) of a fluid 34 is connected to the nozzle 32 via a flow passage (not depicted), a valve (not depicted), and the like.

The workpiece 7 can be peeled off from the carrier plate 3 more easily by applying a downward force to the stepped portion 1a by the external force applying member 26 after the fluid 34 is sprayed between the carrier plate 3 and the workpiece 7 from the nozzle 32 or while the fluid 34 is sprayed between the carrier plate 3 and the workpiece 7 from the nozzle 32. Air, water, or the like, for example, can be used as the fluid 34 sprayed between the carrier plate 3 and the workpiece 7. However, the kind or the like of the fluid 34 is not particularly limited.

Figure 4B:
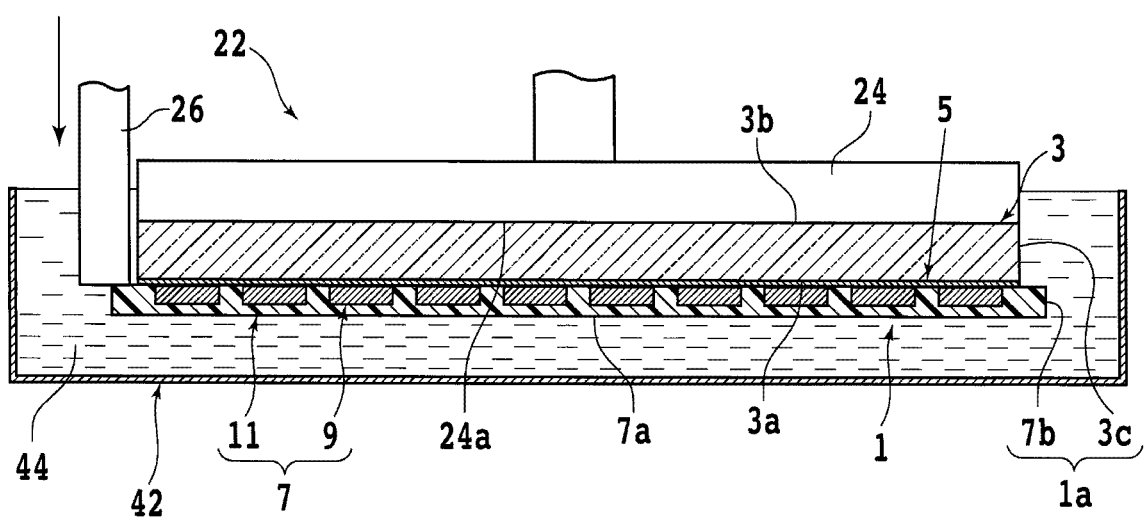
FIG. 4B is a sectional view depicting a removing step in a second modification.

In addition, the carrier plate 3 and the workpiece 7 may be immersed in a liquid when the carrier plate 3 is removed in the removing step. FIG. 4B is a sectional view depicting a removing step according to a second modification. As depicted in FIG. 4B, a tank 42 having such a size as to be able to house the carrier plate 3 and the workpiece 7 is disposed below the carrier plate holding unit 24 of the peeling apparatus 22 used in the second modification. A liquid 44 such as water is stored within the tank 42.

When the workpiece 7 is peeled off from the carrier plate 3 by applying a downward force to the stepped portion 1a by the external force applying member 26 in a state in which the carrier plate 3 and the workpiece 7 are immersed in the liquid 44 within the tank 42, the peeled workpiece 7 falls in the liquid 44. As a result, an impact accompanying the fall is reduced as compared with a case where the workpiece 7 is dropped in the air, so that damage to the workpiece 7, vibration of the peeling apparatus 22, and the like can be prevented.

Incidentally, the liquid 44 may include a surfactant. An anionic surfactant, a cationic surfactant, or the like that easily enters the provisional bonding layer 5 can be used as the surfactant included in the liquid 44. Thus, when the surfactant that easily enters the provisional bonding layer 5 is included in the liquid 44, the provisional bonding layer 5 is easily separated from a region that the surfactant enters, and thus the workpiece 7 can be peeled off from the carrier plate 3 more easily.

In addition, in the second modification, a vibration such as an ultrasonic wave may be applied to the external force applying member 26 when the external force applying member 26 applies a downward force to the stepped portion 1a after the carrier plate 3 and the workpiece 7 are immersed in the liquid 44. Specifically, the external force applying member 26 applies a downward force to the stepped portion 1a while a vibration such as an ultrasonic wave is applied to the external force applying member 26. In this case, the workpiece 7 can be peeled off from the carrier plate 3 more easily due to the action of the vibration transmitted from the external force applying member 26.

Similarly, a vibration such as an ultrasonic wave may be applied to the liquid 44 when the external force applying member 26 applies a downward force to the stepped portion 1a after the carrier plate 3 and the workpiece 7 are immersed in the liquid 44. Specifically, the external force applying member 26 applies a downward force to the stepped portion 1a while a vibration such as an ultrasonic wave is applied to the liquid 44. In this case, the workpiece 7 can be peeled off from the carrier plate 3 more easily due to the action of the vibration transmitted from the liquid 44.

Figure 5A:
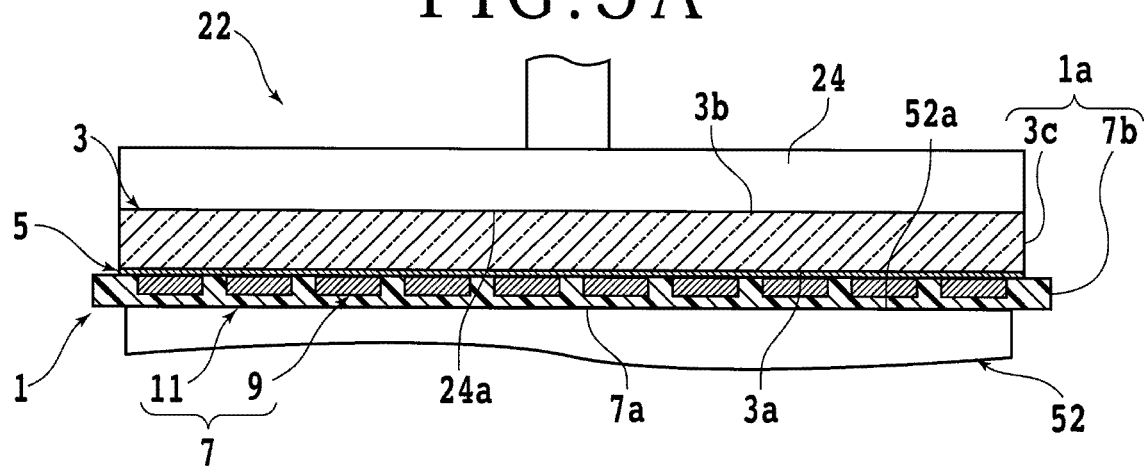
FIG. 5A is a sectional view depicting a carrier plate holding step and a workpiece holding step in a third modification.
Figure 5B:
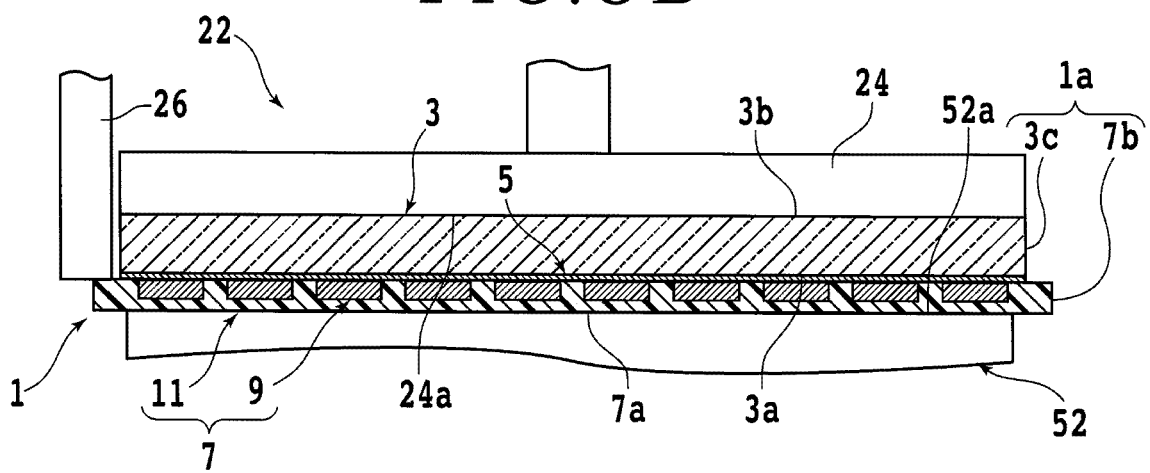
FIG. 5B is a sectional view depicting a state in which an external force applying member is brought into contact with the stepped portion in a removing step in the third modification.
Figure 5C:
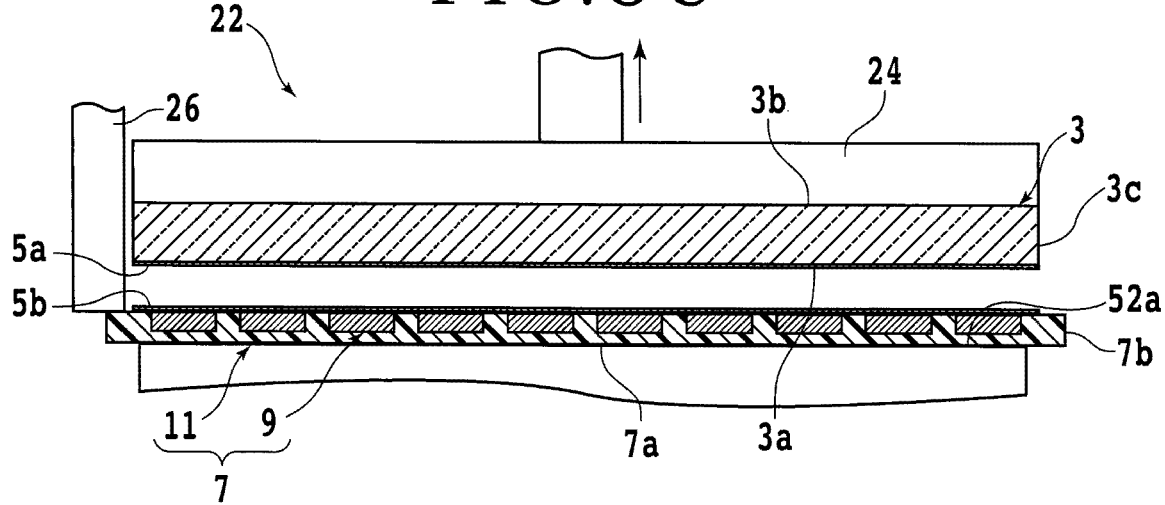
FIG. 5C is a sectional view depicting a state in which a carrier plate holding unit is moved upward relative to the external force applying member and a workpiece holding unit in the removing step in the third modification.

In addition, a workpiece holding step of holding the workpiece 7 side of the composite substrate 1 by a workpiece holding unit may be performed before the removing step is performed after the carrier plate holding step is performed. FIG. 5A is a sectional view depicting the carrier plate holding step and the workpiece holding step according to a third modification. FIG. 5B is a sectional view depicting a state in which the external force applying member 26 is brought into contact with the stepped portion 1a in the removing step in the third modification. FIG. 5C is a sectional view depicting a state in which the carrier plate holding unit 24 is moved upward relative to the external force applying member 26 and the workpiece holding unit (support table) 52 in the removing step in the third modification.

In the third modification, as depicted in FIG. 5A, the carrier plate 3 side of the composite substrate 1 is held by the carrier plate holding unit 24 from above in the carrier plate holding step, and thereafter the workpiece holding step is performed which holds (supports) the workpiece 7 by a holding surface (upper surface) 52a of a workpiece holding unit 52. Specifically, the workpiece holding unit 52 is positioned below the carrier plate holding unit 24 holding the composite substrate 1, then the carrier plate holding unit 24 is lowered, and the first surface 7a of the workpiece 7 is brought into contact with the holding surface 52a of the workpiece holding unit 52.

In the following removing step, in a state in which the external force applying member 26 is in contact with the stepped portion 1a from the carrier plate 3 side as depicted in FIG. 5B, the carrier plate holding unit 24 is moved upward relative to the external force applying member 26 and the workpiece holding unit 52 as depicted in FIG. 5C. It is thereby possible to peel the workpiece 7 off from the carrier plate 3 by applying a downward force to the stepped portion 1a, and remove the carrier plate 3 from the workpiece 7.

In the third modification, the workpiece holding unit 52 holds the workpiece 7 from below. Thus, even when the workpiece 7 is peeled off from the carrier plate 3, the peeled workpiece 7 does not fall due to gravity. That is, an impact accompanying the fall becomes zero. It is therefore possible to prevent damage to the workpiece 7, vibration of the peeling apparatus 22, and the like more surely.

Figure 6A:
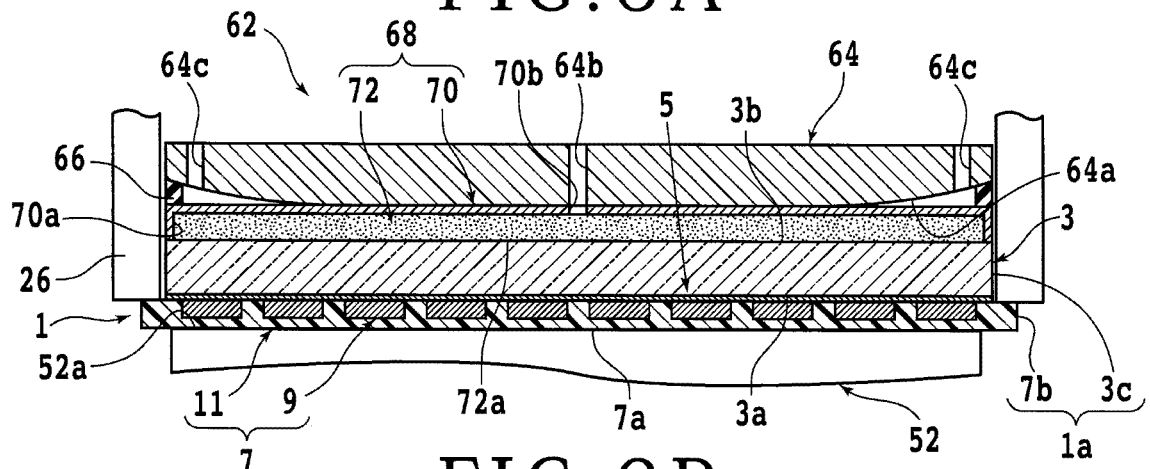
FIG. 6A is a sectional view depicting a state in which the external force applying member is brought into contact with the stepped portion in a removing step in a fourth modification.
Figure 6B:
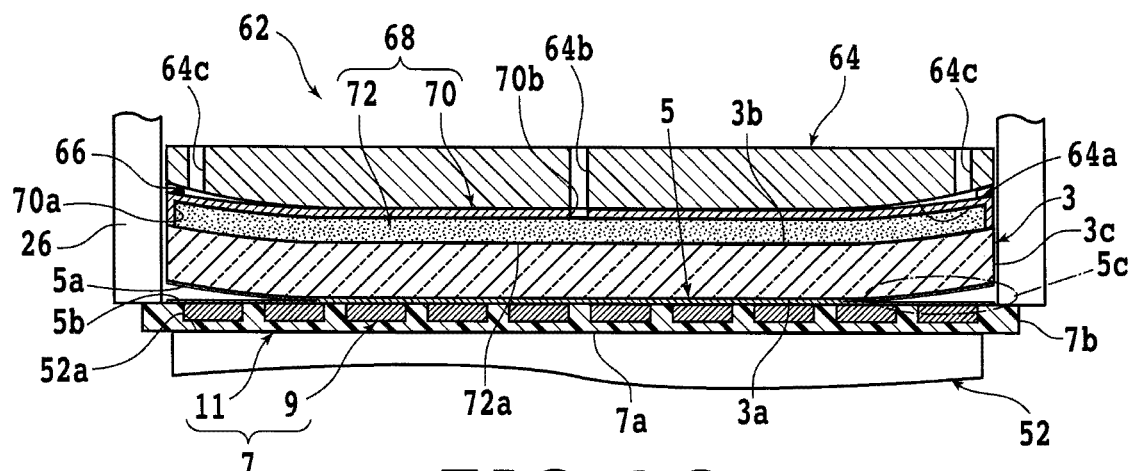
FIG. 6B is a sectional view depicting a state in which a region serving as a starting point at a time of peeling the workpiece from the carrier plate is formed in a provisional bonding layer in the removing step in the fourth modification.
Figure 6C:
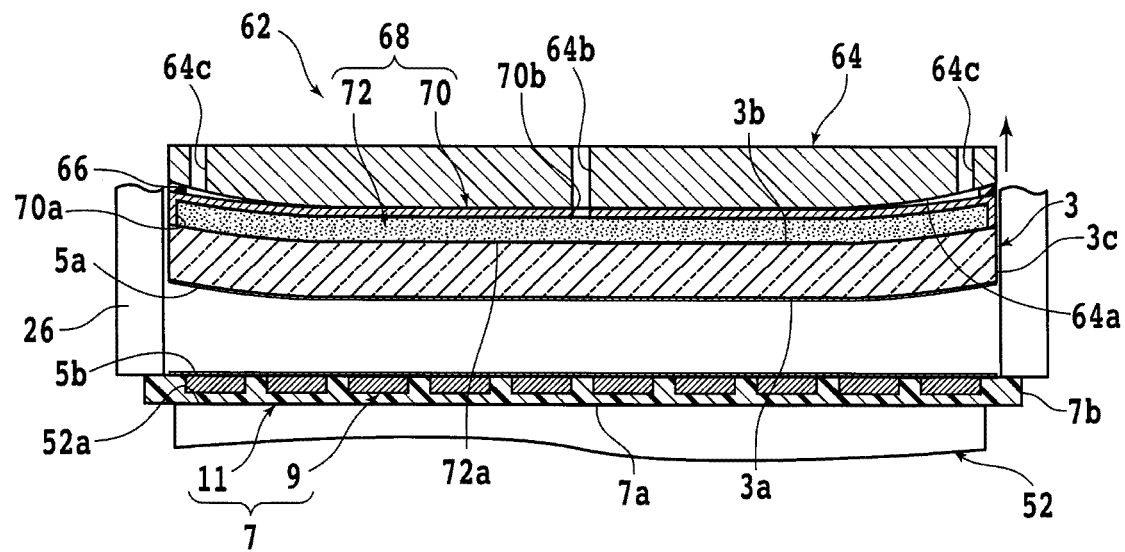
FIG. 6C is a sectional view depicting a state in which the workpiece is peeled off from the carrier plate in the removing step in the fourth modification.

In addition, the carrier plate removing method according to the present invention may be performed by using a peeling apparatus having a structure different from that of the above-described peeling apparatus 22. FIG. 6A is a sectional view depicting a state in which the external force applying member 26 is brought into contact with the stepped portion 1a in a removing step in a fourth modification which step is performed by using a peeling apparatus having a structure different from that of the peeling apparatus 22. FIG. 6B is a sectional view depicting a state in which a region (starting point region) 5c serving as a starting point at a time of peeling the workpiece 7 off from the carrier plate 3 in the removing step in the fourth modification is formed in the provisional bonding layer 5. FIG. 6C is a sectional view depicting a state in which the workpiece 7 is peeled off from the carrier plate 3 in the removing step in the fourth modification.

A basic procedure of a carrier plate removing method according to the fourth modification is similar to the carrier plate removing method according to the third modification. That is, the fourth modification also includes the workpiece holding step in addition to the stepped portion forming step, the carrier plate holding step, and the removing step. However, the fourth modification uses a peeling apparatus 62 having a structure different from that of the peeling apparatus 22. In the following, constituent elements common to the peeling apparatus 22 and the peeling apparatus 62 are identified by the same reference numerals, and description will be made mainly of different constituent elements.

As depicted in FIG. 6A or the like, the peeling apparatus 62 according to the fourth modification includes a base plate (carrier plate holding unit) 64. A reference surface 64a having a similar size to the second surface 3b of the carrier plate 3 is formed on a lower portion of the base plate 64. The reference surface 64a is, for example, curved such that an outer region thereof is located above an inner region thereof. That is, the reference surface 64a is formed by a downwardly protrusion curved surface.

A suction source (not depicted) is connected to a central region of the reference surface 64a via a first flow passage 64b, a first valve (not depicted), and the like. In addition, a suction source is connected to the outer region of the reference surface 64a via a second flow passage 64c, a second valve (not depicted), and the like. An annular sealing member 66 that surrounds substantially the whole of the reference surface 64a is disposed on a peripheral portion of the reference surface 64a. The sealing member 66 is, for example, an O-ring formed by a material such as rubber exhibiting a predetermined elasticity. The sealing member 66 is suitable for maintaining airtightness.

A flexible plate (carrier plate holding unit) 68 having flexibility is disposed on the reference surface 64a side of the base plate 64. The flexible plate 68 includes a frame 70 that is substantially flat in a state in which no force is applied externally. A recessed portion 70a is formed on the lower surface side of the frame 70. A porous plate 72 is fixed to the recessed portion 70a.

The flexible plate 68 is connected to the base plate 64 such that a central region of the upper surface of the frame 70 is in contact with a central region of the reference surface 64a and a peripheral portion of the upper surface of the frame 70 is in contact with the sealing member 66. That is, in a state in which no force is externally applied to the flexible plate 68, a gap is formed between the outer region of the reference surface 64a and the peripheral portion of the upper surface of the frame 70, as depicted in FIG. 6A.

A through hole 70b connected to the first flow passage 64b is formed in the central region of the upper surface of the frame 70. Therefore, when the first valve is opened, a negative pressure of the suction source can be made to act on a lower surface 72a of the plate 72 through the first flow passage 64b and the through hole 70b. On the other hand, when the second valve is opened, an air present in the gap between the outer region of the reference surface 64a and the peripheral portion of the upper surface of the frame 70 (space surrounded by the sealing member 66) is exhausted through the second flow passage 64c. As a result, the gap between the outer region of the reference surface 64a and the peripheral portion of the upper surface of the frame 70 is decompressed, the sealing member 66 is deformed, and the flexible plate 68 is curved along the reference surface 64a.

In the fourth modification, as depicted in FIG. 6A, the workpiece holding step is performed which holds the workpiece 7 by the holding surface 52a of the workpiece holding unit 52 after the carrier plate holding step of holding the carrier plate 3 side of the composite substrate 1. In the carrier plate holding step, the lower surface 72a of the flexible plate 68 is brought into contact with the second surface 3b of the carrier plate 3. Then, the first valve is opened to make a negative pressure of the suction source act on the lower surface 72a. The carrier plate 3 side of the composite substrate 1 is thereby held by the base plate 64 and the flexible plate 68 from above.

In the workpiece holding step, for example, the workpiece holding unit 52 is positioned below the base plate 64 and the flexible plate 68 holding the composite substrate 1, then the base plate 64 and the flexible plate 68 are lowered, and the first surface 7a of the workpiece 7 is brought into contact with the holding surface 52a of the workpiece holding unit 52.

In the following removing step, as depicted in FIG. 6B, first, the first valve is opened to decompress the gap between the outer region of the reference surface 64a and the peripheral portion of the upper surface of the frame 70 in a state in which the external force applying member 26 is in contact with the stepped portion 1a from the carrier plate 3 side. The flexible plate 68 is thereby curved along the reference surface 64a in a state of holding the carrier plate 3 side of the composite substrate 1. That is, an upward force that curves the carrier plate 3 side acts on the peripheral portion 3c of the carrier plate 3.

On the other hand, the external force applying member 26 is in contact with the workpiece 7 side (peripheral portion 7b) of the stepped portion 1a, and therefore the workpiece 7 is not curved, unlike the carrier plate 3. As a result, as depicted in FIG. 6C, the peripheral portion 3c of the carrier plate 3 is curved in a direction of separating from the workpiece 7, and an end portion of the provisional bonding layer 5 can be separated into a first part 5a on the carrier plate 3 side and a second part 5b on the workpiece 7 side. A region 5c separated into the first part 5a and the second part 5b at the end portion of the provisional bonding layer 5 serves as a starting point at a time of peeling the carrier plate 3 off from the workpiece 7.

After the region 5c is formed, as depicted in FIG. 6C, the base plate 64 and the flexible plate 68 are moved above relative to the external force applying member 26 and the workpiece holding unit 52. It is thereby possible to peel the workpiece 7 off from the carrier plate 3 with the region 5c as a starting point by applying a downward force to the stepped portion 1a, and remove the carrier plate 3 from the workpiece 7.

In the fourth modification, the workpiece holding unit 52 holds the workpiece 7 from below. Thus, even when the workpiece 7 is peeled off from the carrier plate 3, the peeled workpiece 7 does not fall due to gravity. That is, an impact accompanying the fall becomes zero. It is therefore possible to prevent damage to the workpiece 7, vibration of the peeling apparatus 22, and the like more surely.

In addition, in the fourth modification, a region serving as a starting point at a time of removing the carrier plate 3 from the workpiece 7 (starting point region) 5c is formed in the provisional bonding layer 5 by curving the peripheral portion 3c of the carrier plate 3 in a direction of separating from the workpiece 7. The workpiece 7 can therefore be peeled off from the carrier plate 3 easily with a small force.

Further, in the embodiment and each of the modifications described above, description has been made of a mode in which the carrier plate holding unit holds the carrier plate 3 side of the composite substrate 1 from above or the workpiece holding unit holds the workpiece 7 side of the composite substrate 1 from below. However, a relation between directions (for example, up and down) indicated in the embodiment and each of the modifications may be interchanged.

Specifically, for example, the carrier plate holding unit can hold the carrier plate 3 side of the composite substrate 1 from below, or the workpiece holding unit can hold the workpiece 7 side of the composite substrate 1 from above. Incidentally, in this case, the external force applying member is brought into contact with the stepped portion 1a from below.

Figure 7A:
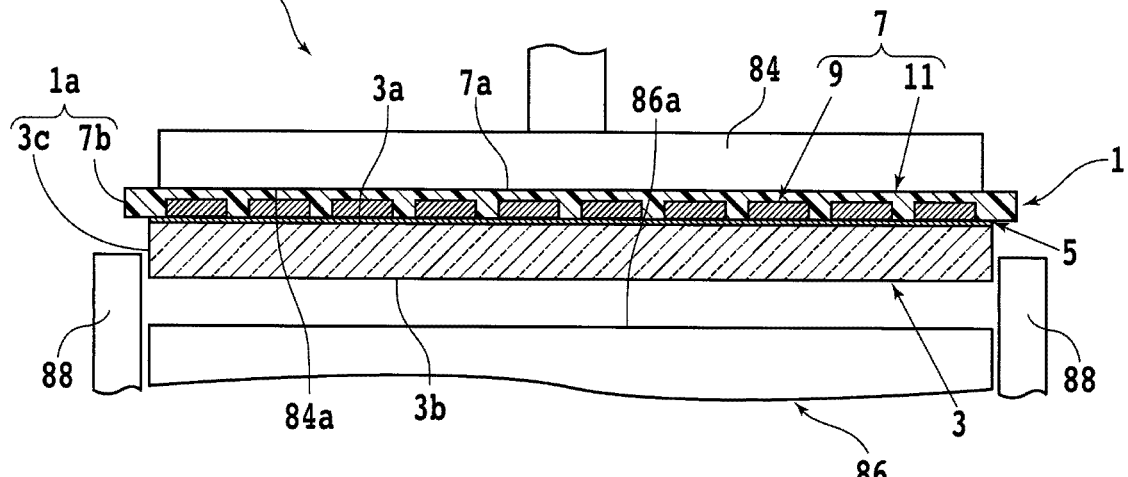
FIG. 7A is a sectional view depicting a workpiece holding step in a fifth modification.
Figure 7B:
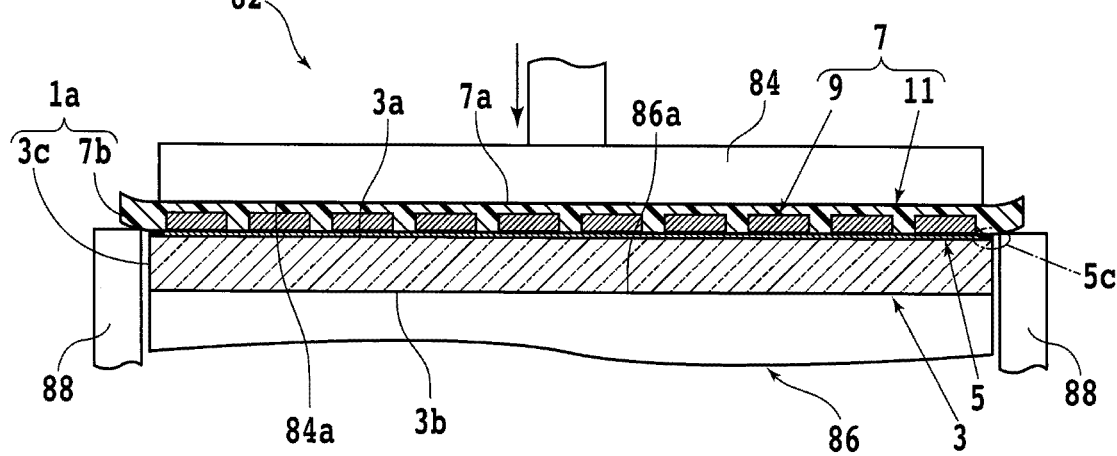
FIG. 7B is a sectional view depicting a state in which a region serving as a starting point at a time of peeling the workpiece from the carrier plate is formed in the provisional bonding layer in a removing step in the fifth modification.
Figure 7C:
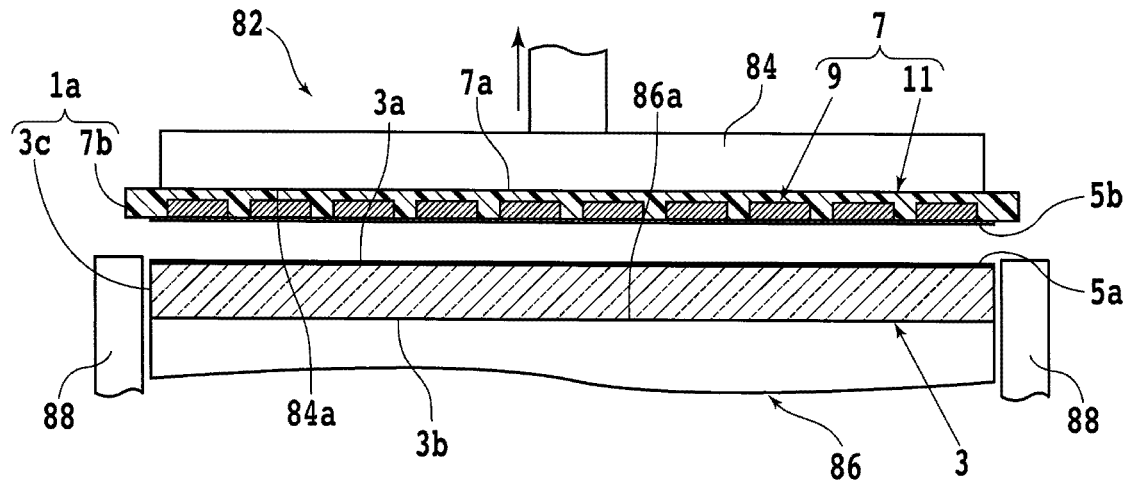
FIG. 7C is a sectional view depicting a state in which the workpiece is peeled off from the carrier plate in the removing step in the fifth modification.

FIG. 7A is a sectional view depicting a workpiece holding step in a fifth modification. FIG. 7B is a sectional view depicting a state in which a region (starting point region) 5c serving as a starting point at a time of peeling the workpiece 7 off from the carrier plate 3 in a removing step in the fifth modification is formed in the provisional bonding layer 5. FIG. 7C is a sectional view depicting a state in which the workpiece 7 is peeled off from the carrier plate 3 in the removing step in the fifth modification.

In a carrier plate removing method according to the fifth modification, the workpiece holding step is performed after a stepped portion forming step is performed. In addition, a carrier plate holding step and the removing step are performed after the workpiece holding step is performed. Incidentally, in the fifth modification, the carrier plate holding step is performed while the removing step is performed.

As depicted in FIG. 7A and the like, the fifth modification uses a peeling apparatus 82 having a structure different from those of the peeling apparatus 22 and the peeling apparatus 62. The peeling apparatus 82 includes a workpiece holding unit 84 for holding the workpiece 7 side of the composite substrate 1 from above. A holding surface 84a smaller than the first surface 7a of the workpiece 7 is formed on a lower portion of the workpiece holding unit 84.

A suction source (not depicted) is connected to the holding surface 84a via a flow passage (not depicted), a valve (not depicted), and the like. Therefore, when the valve is opened, a negative pressure of the suction source can be made to act on the holding surface 84a. In addition, the workpiece holding unit 84 is supported by a raising and lowering mechanism (not depicted), and is thereby moved in the vertical direction.

A carrier plate holding unit 86 is disposed below the workpiece holding unit 84. A holding surface 86a having a similar size to the second surface 3b of the carrier plate 3 is formed on an upper portion of the carrier plate holding unit 86. A suction source (not depicted) is connected to the holding surface 86a via a flow passage (not depicted), a valve (not depicted), and the like. Therefore, when the valve is opened, a negative pressure of the suction source can be made to act on the holding surface 86a.

On a side of the carrier plate holding unit 86, a rod-shaped external force applying member (push member) 88 having a distal end oriented upward is disposed at a position corresponding to the stepped portion 1a of the composite substrate 1 held by the carrier plate holding unit 86. The external force applying member 88 is, for example, fixed to the casing (not depicted) of the peeling apparatus 22, the carrier plate holding unit 86, or the like. Therefore, a positional relation between the carrier plate holding unit 86 and the external force applying member 88 does not change.

In addition, the height of the distal end (upper end) of the external force applying member 88 is adjusted such that the peripheral portion 7b of the workpiece 7 which peripheral portion constitutes the stepped portion 1a can be pushed upward when the carrier plate 3 is brought into contact with the holding surface 86a of the carrier plate holding unit 86. That is, a difference in height between the holding surface 86a of the carrier plate holding unit 86 and the distal end of the external force applying member 88 is larger than a sum of the thickness of the carrier plate 3 and the thickness of the provisional bonding layer 5.

In the workpiece holding step, as depicted in FIG. 7A, the holding surface 84a of the workpiece holding unit 84 is brought into contact with the first surface 7a of the workpiece 7 in a state in which the workpiece 7 is located above the carrier plate 3, for example. Then, the valve is opened to make a negative pressure of the suction source act on the holding surface 84a. The workpiece 7 side of the composite substrate 1 is thereby held by the workpiece holding unit 84 from above.

After the workpiece holding step, the carrier plate holding step of holding the carrier plate 3 by the carrier plate holding unit 86 and the removing step of removing the carrier plate 3 from the workpiece 7 are performed. Specifically, for example, as depicted in FIG. 7B, the workpiece holding unit 84 holding the workpiece 7 side of the composite substrate 1 is lowered, and the second surface 3b of the carrier plate 3 is brought into contact with the holding surface 86a of the carrier plate holding unit 86.

As described above, the difference in height between the holding surface 86a of the carrier plate holding unit 86 and the distal end of the external force applying member 88 is larger than the sum of the thickness of the carrier plate 3 and the thickness of the provisional bonding layer 5. Hence, when the workpiece holding unit 84 is lowered, the distal end of the external force applying member 88 comes into contact with the stepped portion 1a (peripheral portion 7b) before the second surface 3b of the carrier plate 3 comes into contact with the holding surface 86a of the carrier plate holding unit 86.

Therefore, when the workpiece holding unit 84 is further lowered from this state, an upward force is applied from the external force applying member 88 to the stepped portion 1a (peripheral portion 7b). As a result, as depicted in FIG. 7B, the peripheral portion 7b of the workpiece 7 is curved in a direction of separating from the carrier plate 3, and an end portion of the provisional bonding layer 5 can be separated into a first part 5a on the carrier plate 3 side (see FIG. 7C) and a second part 5b on the workpiece 7 side (see FIG. 7C). A region 5c separated into the first part 5a and the second part 5b at the end portion of the provisional bonding layer 5 serves as a peeling starting point at a time of peeling the carrier plate 3 off from the workpiece 7.

After the region 5c is formed, as depicted in FIG. 7B, the carrier plate holding unit 86 is made to hold the carrier plate 3 side of the composite substrate 1 by making a negative pressure of the suction source act on the holding surface 86a in a state in which the second surface 3b of the carrier plate 3 is in contact with the holding surface 86a. Thereafter, as depicted in FIG. 7C, the workpiece holding unit 84 is raised. The workpiece 7 is thereby peeled off from the carrier plate 3 with the region 5c as a starting point. That is, the carrier plate 3 can be removed from the workpiece 7 by moving the workpiece 7 in a direction of separating from the carrier plate 3.

In the fifth modification, the region (starting point region) 5c serving as a starting point at a time of removing the carrier plate 3 from the workpiece 7 is formed in the provisional bonding layer 5 by curving the peripheral portion 7b of the workpiece 7 in a direction of separating from the carrier plate 3. The workpiece 7 can therefore be peeled off from the carrier plate 3 easily with a small force.

The embodiment and the modifications described above can be combined optionally. For example, the first modification may be further combined with the second modification. In this case, a fluid is sprayed between the carrier plate 3 and the workpiece 7 (into a region corresponding to the provisional bonding layer 5) after the carrier plate 3 and the workpiece 7 are immersed in the liquid 44. That is, the workpiece 7 is peeled off from the carrier plate 3 by applying a downward force to the stepped portion 1a by the external force applying member 26 after the fluid 34 is sprayed between the carrier plate 3 and the workpiece 7 or while the fluid 34 is sprayed between the carrier plate 3 and the workpiece 7.

Besides, structures, methods, and the like according to the embodiment and the modifications described above can be modified and implemented as appropriate without departing from the objective scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A carrier plate removing method for removing a carrier plate from a workpiece having a plurality of device chips, and being disposed on a top surface of the carrier plate via a provisional bonding layer, the carrier plate removing method comprising:
   a stepped portion forming step of forming a stepped portion in which a peripheral side portion of the workpiece projects sideward beyond a peripheral side portion of the carrier plate by removing a peripheral portion of the carrier plate along a peripheral edge of the carrier plate from an undersurface side opposite from the top surface of the carrier plate and a part of the provisional bonding layer along the peripheral edge in a depth direction of the provisional bonding layer without cutting entirely through the provisional bonding layer;
   a carrier plate holding step of holding the carrier plate by a carrier plate holding unit after performing the stepped portion forming step; and
   a removing step of removing the carrier plate from the workpiece by applying a force from the carrier plate side to the stepped portion, and moving the workpiece in a direction of separation from the carrier plate after performing the stepped portion forming step.

2. The carrier plate removing method according to claim 1, wherein
   in the removing step, the workpiece is moved in the direction of separation from the carrier plate by the force applied to the stepped portion.

3. The carrier plate removing method according to claim 2, further comprising:
   a workpiece holding step of holding the workpiece by a workpiece holding unit before performing the removing step.

4. The carrier plate removing method according to claim 3, wherein
   in the removing step, the carrier plate is removed from the workpiece by applying the force to the stepped portion by moving the carrier plate holding unit relative to the workpiece holding unit and an external force applying member in a state in which the external force applying member is held in contact with the stepped portion from the carrier plate side.

5. The carrier plate removing method according to claim 4, wherein
   in the removing step, a starting point region serving as a starting point at a time of removing the carrier plate from the workpiece is formed in the provisional bonding layer by curving the peripheral portion of the carrier plate in a direction of separation from the workpiece before the carrier plate holding unit is moved relative to the workpiece holding unit and the external force applying member.

6. The carrier plate removing method according to claim 1, wherein
   in the removing step, the workpiece is moved in the direction of separation from the carrier plate after a starting point region serving as a starting point at a time of removing the carrier plate from the workpiece is formed in the provisional bonding layer by curving a peripheral portion of the workpiece in the direction of separating from the carrier plate by the force applied to the stepped portion.

7. The carrier plate removing method according to claim 6, further comprising:
a workpiece holding step of holding the workpiece by a workpiece holding unit before performing the removing step.

8. The carrier plate removing method according to claim 1, wherein
in the removing step, the carrier plate is removed from the workpiece by applying the force to the stepped portion after spraying a fluid between the workpiece and the carrier plate or while spraying the fluid between the workpiece and the carrier plate.

9. The carrier plate removing method according to claim 1, wherein
in the removing step, the carrier plate is removed from the workpiece by applying the force to the stepped portion in a state in which the workpiece and the carrier plate are immersed in a liquid.

10. The carrier plate removing method according to claim 9, wherein
in the removing step, the carrier plate is removed from the workpiece by applying the force to the stepped portion by pressing an external force applying member to which vibration is imparted against the stepped portion in a state in which the workpiece and the carrier plate are immersed in the liquid.

11. The carrier plate removing method according to claim 9, wherein
in the removing step, the carrier plate is removed from the workpiece by applying the force to the stepped portion while imparting vibration to the liquid in a state in which the workpiece and the carrier plate are immersed in the liquid.

12. The carrier plate removing method according to claim 9, wherein
the liquid includes a surfactant.

* * * * *